(12) United States Patent
Liu et al.

(10) Patent No.: US 10,534,321 B2
(45) Date of Patent: Jan. 14, 2020

(54) CPT ATOMIC CLOCK SERVO CONTROL SOC

(71) Applicant: CHINA ELECTRONICS TECHNOLOGY GROUP CORPORATION CHONGQING ACOUSTIC-OPTIC-ELECTRONIC CO., LTD., Chongqing (CN)

(72) Inventors: Lintao Liu, Chongqing (CN); Yuhan Gao, Chongqing (CN); Haoming Du, Chongqing (CN); Xiaozong Huang, Chongqing (CN); Jun Deng, Chongqing (CN)

(73) Assignee: CHINA ELECTRONICS TECHNOLOGY GROUP CORPORATION CHONGQING ACOUSTIC-OPTIC-ELECTRONIC CO., LTD., Xiyong Town, Shapingba District, Chongqing (CN)

( * ) Notice: Subject to any disclaimer, the term of this patent is extended or adjusted under 35 U.S.C. 154(b) by 0 days.

(21) Appl. No.: 16/056,537

(22) Filed: Aug. 7, 2018

(65) Prior Publication Data

US 2019/0056697 A1 Feb. 21, 2019

(30) Foreign Application Priority Data

Aug. 8, 2017 (CN) .......................... 2017 1 0671962

(51) Int. Cl.
*G04F 5/14* (2006.01)
*H03B 17/00* (2006.01)
*H03L 7/26* (2006.01)

(52) U.S. Cl.
CPC ................ *G04F 5/145* (2013.01); *G04F 5/14* (2013.01); *H03B 17/00* (2013.01); *H03L 7/26* (2013.01)

(58) Field of Classification Search
CPC ........... G04F 5/145; G04F 5/14; H03B 17/00; H03L 7/26; H03L 7/08
USPC ...................................................... 331/94.1, 3
See application file for complete search history.

(56) References Cited

U.S. PATENT DOCUMENTS 6,900,702 B2 * 5/2005 Youngner ................. G04F 5/14
331/94.1

* cited by examiner

*Primary Examiner* — Arnold M Kinkead
(74) *Attorney, Agent, or Firm* — Global IP Services; Tianhua Gu

(57) ABSTRACT

The present invention relates to a CPT atomic clock servo control SoC, which includes a microprocessor, a photoelectric signal demodulation functional module, a temperature control loop functional module, a laser and microwave loop control functional module, a C field control functional module, and a bus bridge. The bus bridge is connected to a system bus and a peripheral bus, for connecting to buses with different speeds. The photoelectric signal demodulation functional module extracts power change information of a microwave and a laser. The temperature control loop functional module controls temperatures of an absorption cell and a laser tube. The laser and microwave loop control functional module implements laser frequency locking and microwave loop locking. The C field control functional module provides a stable C field for the absorption cell.

9 Claims, 9 Drawing Sheets

CPT ATOMIC CLOCK SERVO CONTROL SOC

CROSS REFERENCES TO RELATED APPLICATIONS

This application claims the benefit of priority to Chinese Patent Application No. CN201710671962.3, entitled "CPT atomic clock servo control SoC", filed with SIPO on Aug. 8, 2017, the contents of which are incorporated herein by reference in its entirety.

FIELD OF INVENTION

The present invention relates to a CPT atomic clock, and specifically to a CPT atomic clock servo control SoC.

DESCRIPTION OF RELATED ARTS

The CPT (Coherent Population Trapping) atomic clock is a novel atomic clock implemented by using a coherent population trapping principle of atoms. The CPT atomic clock does not need a microwave resonant cavity. Therefore, it can be designed to have a small volume, and it is considered that the CPT atomic clock can be integrated on a chip, and therefore is also referred to as a chip-level atomic clock. The CPT atomic clock has wide application prospects in fields such as navigation positioning, timing, and synchronous communication.

The patent entitled "SERVO CIRCUIT OF CPT ATOMIC CLOCK" with the application No. 201120043582.3 discloses a servo circuit of a CPT atomic clock. The servo circuit includes a microcontroller, where a signal input end of the microcontroller is connected to a photoelectric detector of a physical unit of the atomic clock, a signal output end of the microcontroller is connected to a laser of the physical unit of the atomic clock by using a frequency signal output circuit and a frequency conversion stage circuit in sequence, the signal output end of the microcontroller is connected to the laser of the physical unit of the atomic clock by using a constant current source circuit, and the signal input end and the signal output end of the microprocessor are respectively connected to a temperature control circuit and a magnetic field detection circuit. The frequency signal output circuit uses a voltage controlled temperature compensated crystal oscillator. The frequency conversion stage circuit uses a direct digital synthesizer and a phase-lock loop. The constant current source circuit uses a constant current source controller.

According to the disclosure of patent 201120043582.3, a microcontroller is used as a core, which is responsible for monitoring a temperature and a magnetic field, controlling a digital device, phase sensitive detection, generating a square wave modulation signal, and regulating a constant current source current, thereby implementing automatic scanning and locking control on a laser frequency and a microwave frequency. However, the technical solution has failed to meet the requirement of modern weaponry on design aspects such as miniaturization, low power consumption, and reliability.

SUMMARY OF THE PRESENT INVENTION

The present invention provides a CPT atomic clock servo control SoC.

A CPT atomic clock servo control SoC, comprising a microprocessor, a photoelectric signal demodulation functional module, a temperature control loop functional module, a laser and microwave loop control functional module, a C field control functional module, and a bus bridge, wherein the bus bridge is connected to a system bus and a peripheral bus, used for connecting to buses with different speeds; the photoelectric signal demodulation functional module is connected to the peripheral bus, used for demodulating a photoelectric signal of a physical system of the atomic clock, and extracting power change information of a microwave and a laser therefrom; the temperature control loop functional module is connected to the peripheral bus, used for separately controlling temperatures of an absorption cell and a laser tube in the physical system of the atomic clock; the laser and microwave loop control functional module is connected to the peripheral bus, used for performing low frequency modulation on the microwave and a drive DC current of a VCSEL, and then synthesizing, by using Bias-T, a modulated microwave signal with certain power and a certain frequency and the modulated DC current, and then inputting the synthesized signal into the VCSEL of the physical system of the atomic clock, to implement laser frequency locking; after the laser frequency locking, modulation and phase sensitive demodulation are performed on the microwave to obtain a negative voltage feedback signal which is applied to a voltage controlled electrode of a voltage controlled crystal oscillator, to implement locking of a microwave loop; the C field control functional module is connected to the peripheral bus, configures a DAC by using a CPU, outputs a stable adjustable voltage, and then converts the voltage into a current signal by using a V-I conversion circuit to drive a solenoid, and provides a stable C field for the absorption cell; and the microprocessor is connected to the system bus, used for controlling the photoelectric signal demodulation functional module, the temperature control loop functional module, the laser and microwave loop control functional module, and the C field control functional module.

Preferably, the CPT atomic clock servo control SoC further comprises a static random access memory, a serial flash memory controller, a clock/reset management module, a general peripheral subsystem, a time to digital conversion module, a clock output module, and a direct memory access controller, wherein the direct memory access controller is connected to the system bus, used for accessing the static random access memory under control of the microprocessor; and the static random access memory is connected to the system bus, used for caching internal data; the serial flash memory controller is connected to the system bus, used for connecting to an external memory; the clock/reset management module is connected to the system bus, used for setting a working mode, setting a clock of each module to implement clock gating management, so as to complete power-on reset, key reset, and watchdog reset; the general peripheral subsystem is connected to the peripheral bus, used for implementing communication interface control and interconnection with an external computer; the time to digital conversion module is connected to the peripheral bus, used for accurately measuring a time difference; the clock output module is connected to the peripheral bus, used for outputting different clock frequencies and implementing clock signal transposition; and the microprocessor is configured to control the static random access memory, the serial flash memory controller, the clock/reset management module, the general peripheral subsystem, the time to digital conversion module, and the clock output module.

Preferably, the photoelectric signal demodulation functional module comprises an analog to digital converter I, a data selector I, a microwave demodulation path, a laser demodulation path, and a digital oscillator;

the analog to digital converter I is connected to a front end photoelectric signal amplifier, used for collecting an amplified photoelectric signal; the data selector I is connected to the analog to the digital converter I, used for dividing data output by the analog to digital converter I into two paths, wherein one path of data is directly connected to the system bus, and the other path of data is fed into a subsequent quadrature demodulation circuit; the microwave demodulation path is connected to the data selector I, and comprises two branches: I and Q branches, and each branch consists of a mixer I and a low pass filter I, used for demodulating to obtain a needed microwave signal; the laser demodulation path is connected to the data selector I, and comprises two branches: I and Q branches, and each branch consists of a mixer II 541 and a low pass filter II 542, for demodulating to obtain a needed microwave signal; and the digital oscillator is separately connected to the mixer in the microwave demodulation path and the mixer in the laser demodulation path, for providing a local-frequency signal needed by demodulation.

Preferably, the temperature control loop functional module comprises a data selector II, an analog to digital converter II, an absorption cell temperature voltage control branch and a VCSEL temperature voltage control branch;

the data selector II is separately connected to an absorption cell temperature voltage signal amplifier and a VCSEL temperature voltage signal amplifier, used for selecting an absorption cell temperature voltage signal or a VCSEL temperature voltage signal, and feeding same into a subsequent analog to digital converter II for sampling; and the analog to digital converter II is connected to the data selector II, used for sampling the absorption cell temperature voltage signal or the VCSEL temperature voltage signal; the absorption cell temperature voltage control branch is connected to the microprocessor by using a bus, used for converting a control signal output by the microprocessor into an analog control signal; and the VCSEL temperature voltage control branch is connected to the microprocessor by using a bus, used for converting a control signal output by the microprocessor into an analog control signal.

Preferably, the laser and microwave loop control functional module comprises a laser loop control branch and a microwave loop control branch;

the laser loop control branch is connected to the microprocessor by using a bus, used for converting a control signal output by the microprocessor into an analog control signal; and the microwave loop control branch is connected to the microprocessor by using a bus, used for converting a control signal output by the microprocessor into an analog control signal.

Preferably, the C field control functional module comprises an analog to digital converter III 81, the analog to digital converter III is connected to the microprocessor by using a bus, used for converting a control signal output by the microprocessor into an analog control signal.

Preferably, the general peripheral subsystem comprises a general purpose input/output, a universal asynchronous transceiving transmitter, a serial peripheral interface, a timer module, and a watchdog module;

the general purpose input/output is connected to the peripheral bus, used for implementing configuration of an interrupt pint or a data pin of a port; and the universal asynchronous transceiving transmitter is connected to the peripheral bus, used for implementing communication with an external device; the serial peripheral interface is connected to the peripheral bus, used for connecting to an external communication device; the timer module is connected to the peripheral bus, used for implementing time control; and the watchdog module is connected to the peripheral bus, used for monitoring and resetting a whole system.

Preferably, the clock/reset management module comprises a clock/reset and a phase-lock loop;

the clock/reset module is configured to generate a clock needed during operation of each module, to implement clock gating management, power-on reset, external key reset, and watchdog reset; and the phase-lock loop is configured to generate a clock signal with needed high phase precision.

Preferably, the clock output module comprises a frequency divider 111 and a phase shift circuit;

the frequency divider is configured to generate a clock signal with a needed frequency; and the phase shift circuit is used for phase control over the clock signal.

BRIEF DESCRIPTION OF THE DRAWINGS

To make the objects, technical solutions, and advantages of the present invention clearer, the following further describes the present disclosure in detail with reference to the accompanying drawings, wherein

FIG. 5A is an enlarged top part of the FIG. 5.

DETAILED DESCRIPTION OF THE PREFERRED EMBODIMENTS

The following describes preferred embodiments of the present invention in detail with reference to the accompanying drawings. It should be understood that the preferred embodiments are used only for describing the present invention, and are not intended to limit the protection scope of the present invention.

Figure 1:
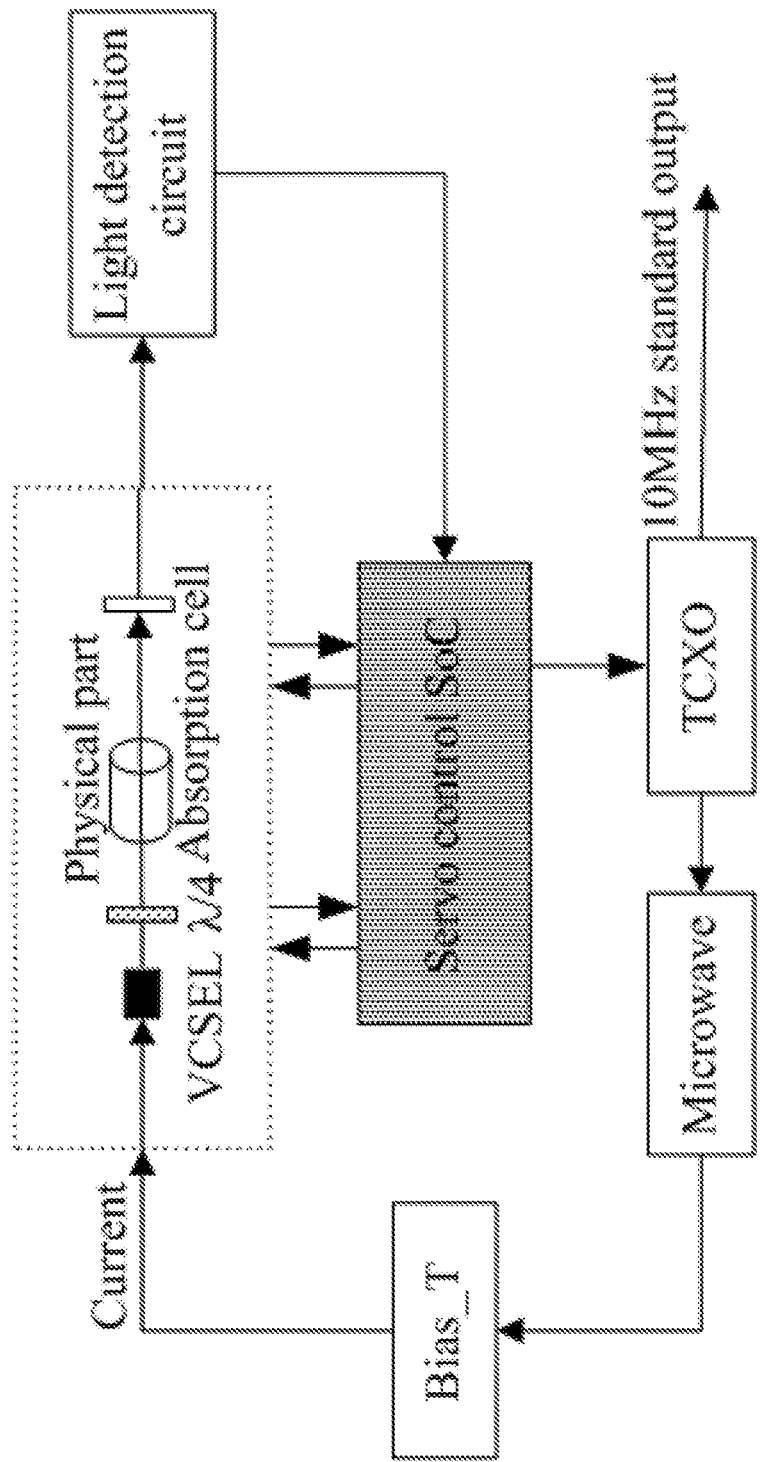
FIG. 1 is a structural schematic diagram of an atomic clock system.
Figure 2:
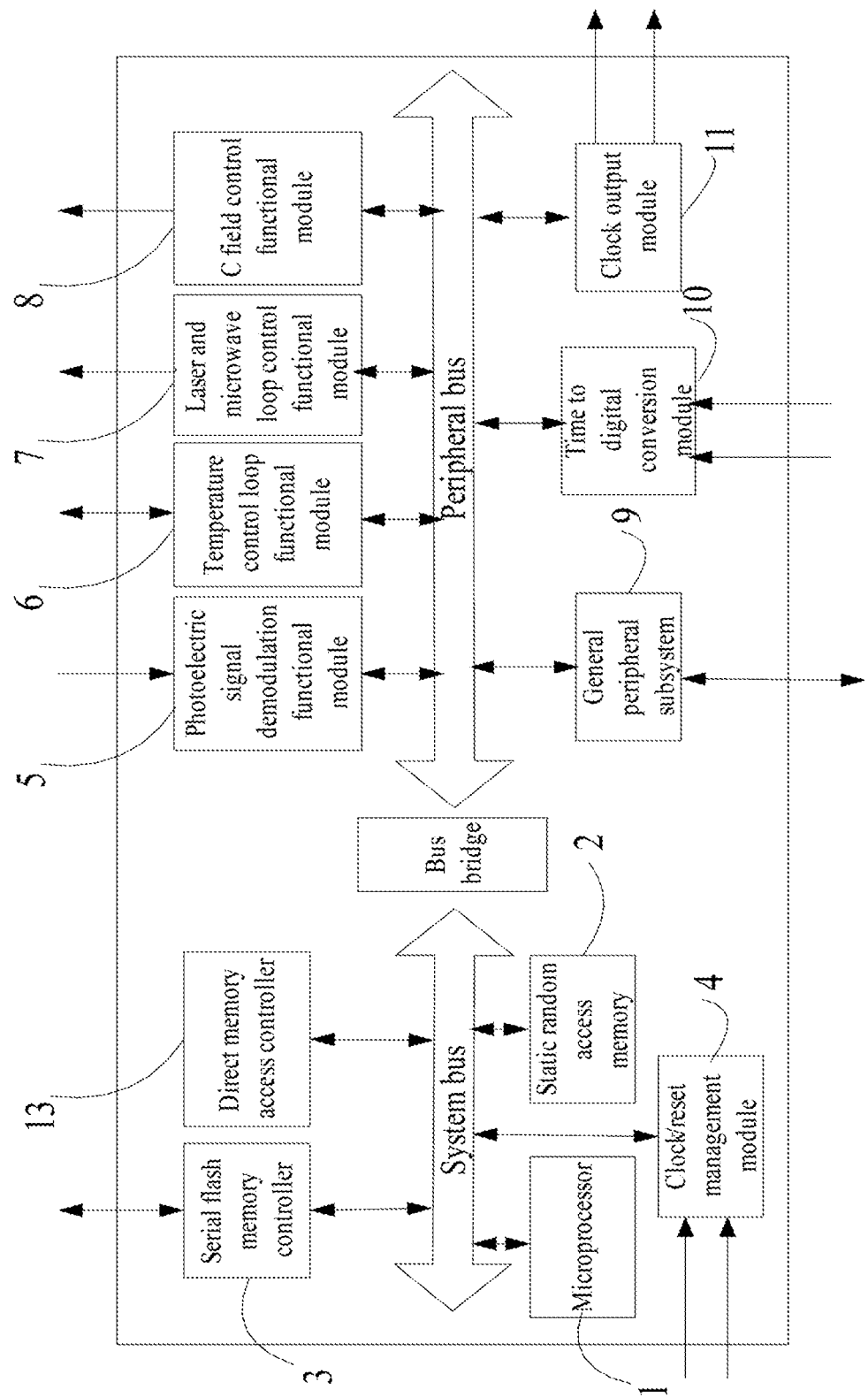
FIG. 2 is a block schematic diagram of a principle of the present invention.

As shown in FIG. 2, a CPT atomic clock servo control SoC (System on a Chip) comprises:

a photoelectric signal demodulation functional module 5, which is connected to a peripheral bus, and is used for demodulating a photoelectric signal output by a physical system, collecting a photoelectric signal output by the physical system, and extracting power change information of a microwave and a laser therefrom;

a temperature control loop functional module 6, which is connected to the peripheral bus, for separately controlling temperatures of an absorption cell and a laser tube in the physical system, so that the absorption cell and the laser tube separately stably work at suitable temperatures;

a laser and microwave loop control functional module 7, which is connected to the peripheral bus, and is used for performing low frequency modulation on the microwave and a drive DC current of a VCSEL (Vertical Cavity Surface Emitting Laser), and then synthesizing, by using Bias-T, a modulated microwave signal and the modulated DC current that are of a particular power and a particular frequency, and then inputting same into the VCSEL of the physical system, to implement laser frequency locking; after the laser frequency locking, modulation and phase sensitive demodulation are performed on the microwave to obtain a negative voltage feedback signal, the negative voltage feedback signal is applied to a voltage controlled electrode of a voltage controlled crystal oscillator to implement locking of a microwave loop;

a C field control functional module 8, which is connected to the peripheral bus, configures a DAC by using a CPU, outputs a stable adjustable voltage, and then the voltage is converted into a current signal by using a V-I conversion circuit to drive a solenoid, which provides a stable C field for the absorption cell, and ensures that a current flowing through the solenoid keeps unchanged when a resistance of the solenoid changes with a temperature of the physical system, thereby providing the stable C field for the absorption cell;

a direct memory access controller 13, which is connected to a system bus, and used for accessing a static random access memory under control of a microprocessor;

a static random access memory 2, which is connected to the system bus, and used for caching internal data;

a serial flash memory controller 3, which is connected to the system bus, and used for connecting to an external memory;

a clock/reset management module 4, which is connected to the system bus, and used for setting a working mode, setting a clock of each module, implementing clock gating management, and completing power-on reset, key reset, and watchdog reset;

a general peripheral subsystem 9, which is connected to the peripheral bus, and used for implementing communication interface control and interconnection with an external computer;

a time to digital conversion module 10, which is connected to the peripheral bus, and used for accurately measuring a time difference;

a clock output module 11, which is connected to the peripheral bus, and used for outputting different clock frequencies and implementing clock signal transposition;

a bus bridge 12, which is connected to the system bus and the peripheral bus, and used for connecting to buses with different speeds; and a microprocessor 1, wherein the microprocessor is connected to the system bus, and used for controlling the photoelectric signal demodulation module, the temperature control loop module, the laser and microwave loop control module, the C field control module, the static random access memory, the serial flash memory controller, the clock/reset management module, the general peripheral subsystem, the time to digital conversion module, and the clock output module.

Figure 3:
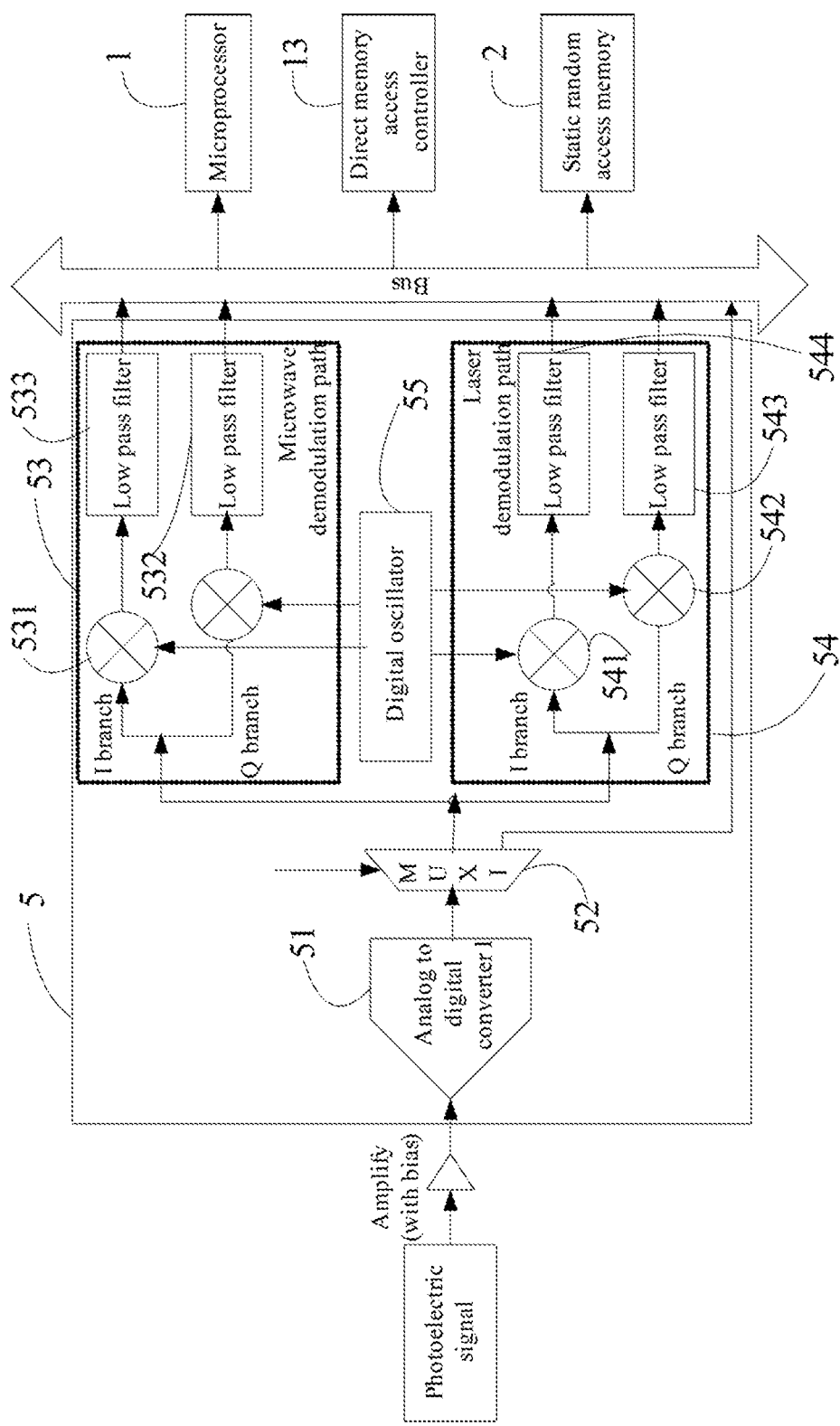
FIG. 3 is a block schematic diagram of a principle of a photoelectric signal demodulation functional module.

As shown in FIG. 3, the photoelectric signal demodulation functional module 5 comprises an analog to digital converter I51, a data selector I(MUX) 52, a microwave demodulation path 53, a laser demodulation path 54, and a digital oscillator 55. The analog to digital converter I51 is connected to a front end photoelectric signal amplifier, and used for collecting an amplified photoelectric signal. The data selector 152 is connected to the analog to digital converter I51, and used for dividing data output by the analog to digital converter I into two paths, wherein one path of data is directly connected to the system bus, and the other path of data is fed into a subsequent quadrature demodulation circuit. The digital oscillator 55 is separately connected to the microwave demodulation path 53 and the laser demodulation path 54, and used for providing a local-frequency signal needed by demodulation. The microwave demodulation path 53 is connected to the data selector 152, and the laser demodulation path 54 is connected to the data selector 152.

The microwave demodulation path 53 comprises two parallel branches: I and Q branches. The I branch comprises a mixer 531 connected in series to a low pass filter 533, and the Q branch comprises a mixer 532 connected in series to a low pass filter 534.

The laser demodulation path 54 comprises two parallel branches: I and Q branches. The I branch comprises a mixer 541 connected in series to a low pass filter 544, and the Q branch comprises a mixer 542 connected in series to a low pass filter 543.

Figure 4:
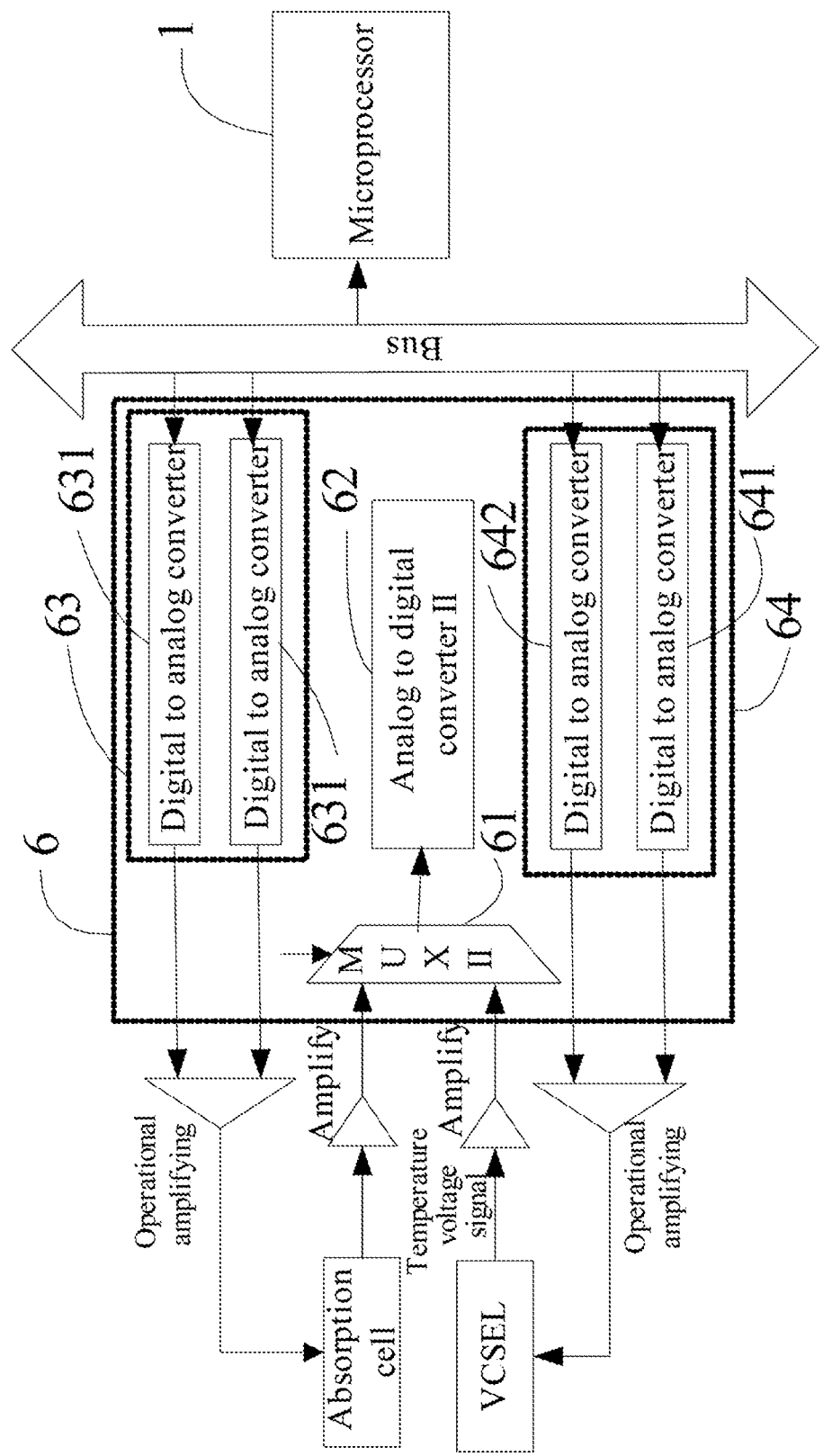
FIG. 4 is a block schematic diagram of a principle of a temperature control loop functional module.

As shown in FIG. 4, the temperature control loop functional module 6 comprises a data selector II(MUX) 61, an analog to digital converter II 62, an absorption cell temperature voltage control branch 63 and a VCSEL temperature voltage control branch 64.

The analog to digital converter II 62 is connected to the data selector II 61, and used for sampling an absorption cell temperature voltage signal or a VCSEL temperature voltage signal.

The data selector II 61 is connected to an off-chip absorption cell temperature voltage signal amplifier and a VCSEL temperature voltage signal amplifier, and used for selecting an absorption cell temperature voltage signal or a VCSEL temperature voltage signal, and feeding same into a subsequent analog to digital converter for sampling.

The absorption cell temperature voltage control branch 63 is connected to the microprocessor 1 by using a bus, and used for converting a control signal output by the microprocessor into an analog control signal.

The VCSEL temperature voltage control branch 64 is connected to the microprocessor 1 by using a bus, and used for converting a control signal output by the microprocessor into an analog control signal.

Figure 5:
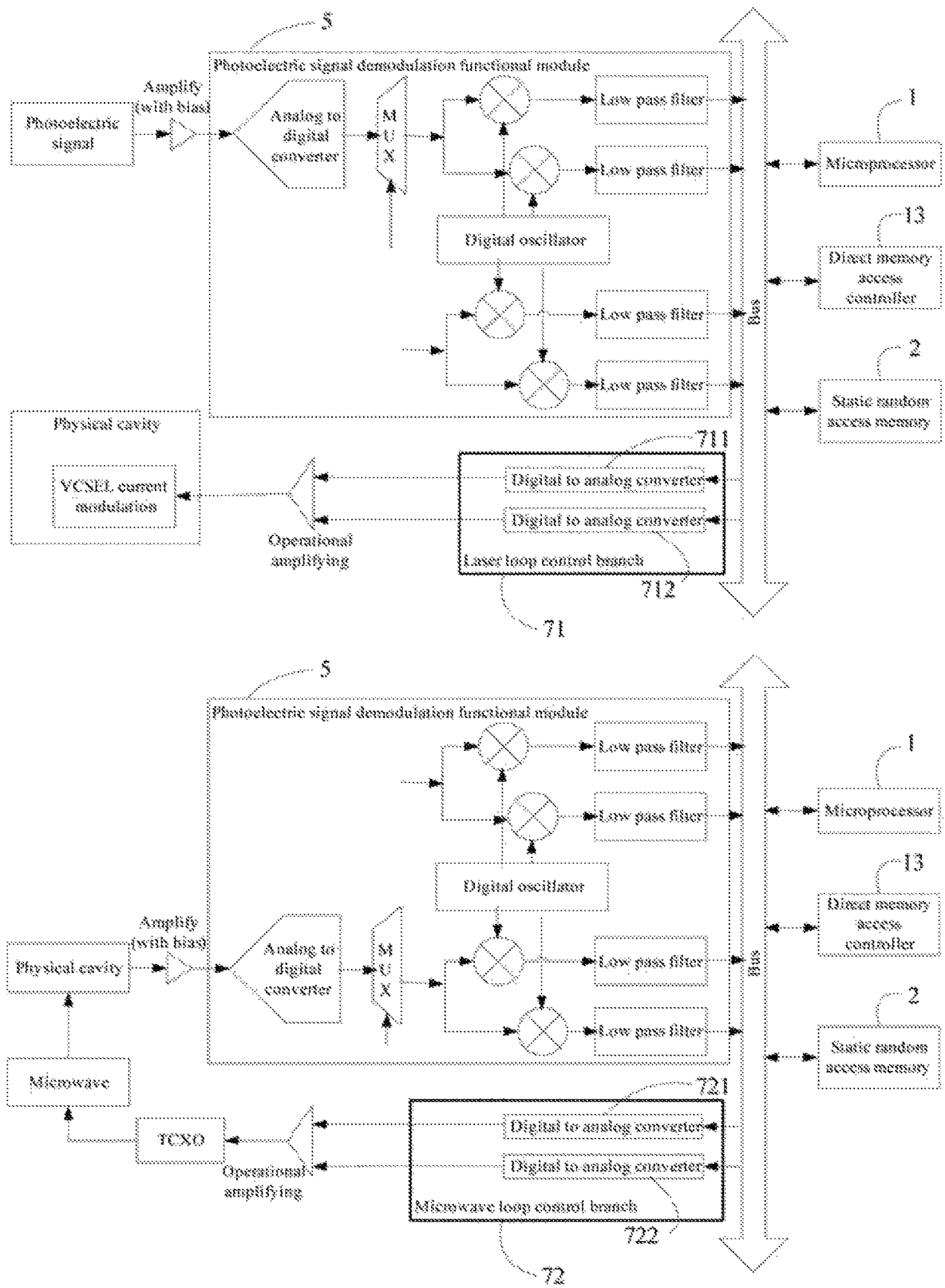
FIG. 5 is a block schematic diagram of a principle of connection between a laser and microwave loop control functional module and a photoelectric signal demodulation functional module.
Figure 5:
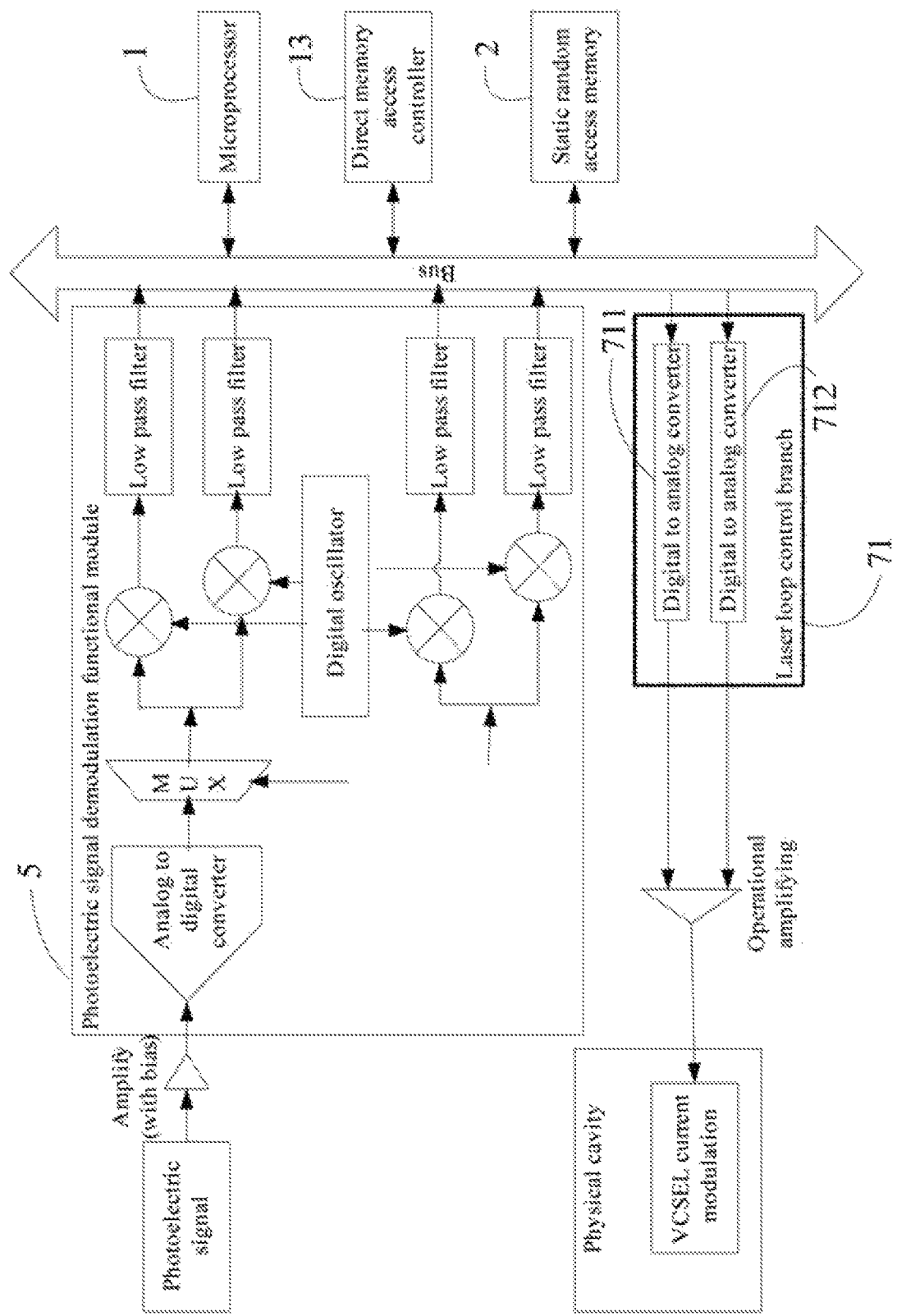
Figure 5B:
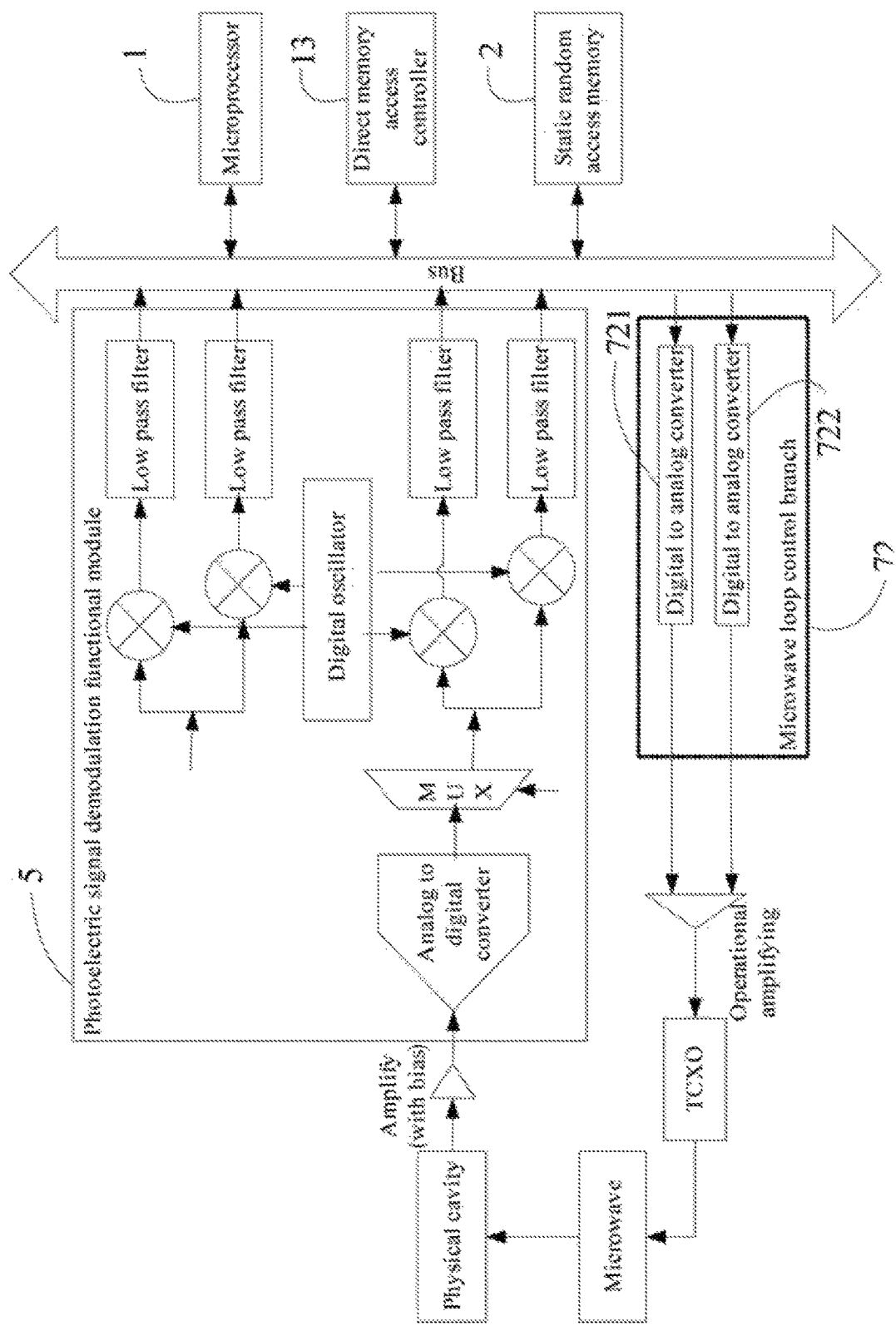
FIG. 5B is an enlarged bottom part of the FIG. 5.

As shown in FIG. 5, the laser and microwave loop control functional module 7 comprises a laser loop control branch 71 and a microwave loop control branch 72. The laser loop control branch 71 is connected to the microprocessor by using a bus, and the microwave loop control branch 72 is connected to the microprocessor by using a bus.

The laser loop control branch 71 comprises two parallel paths of digital to analog converters 711 and 712, used for converting control signals output by the microprocessor into analog control signals.

The microwave loop control branch 72 comprises two parallel paths of digital to analog converters 721 and 722, used for converting control signals output by the microprocessor into analog control signals.

Figure 6:
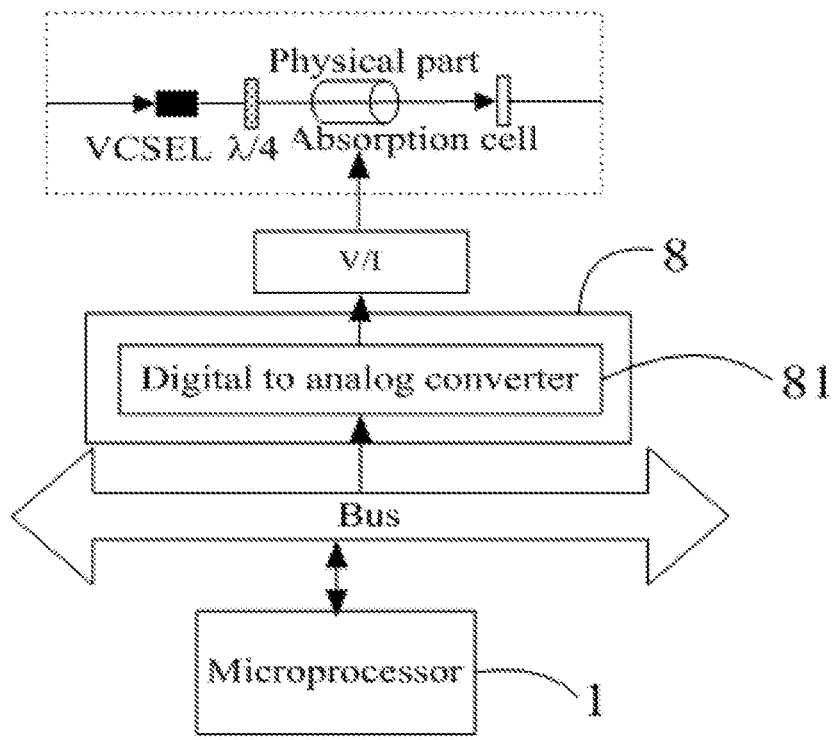
FIG. 6 is a block schematic diagram of a principle of a C field control functional module.

As shown in FIG. 6, the C field control functional module comprises an analog to digital converter 81, the analog to digital converter is connected to the microprocessor by using a bus, and used for converting a control signal output by the microprocessor into an analog control signal.

Figure 7:
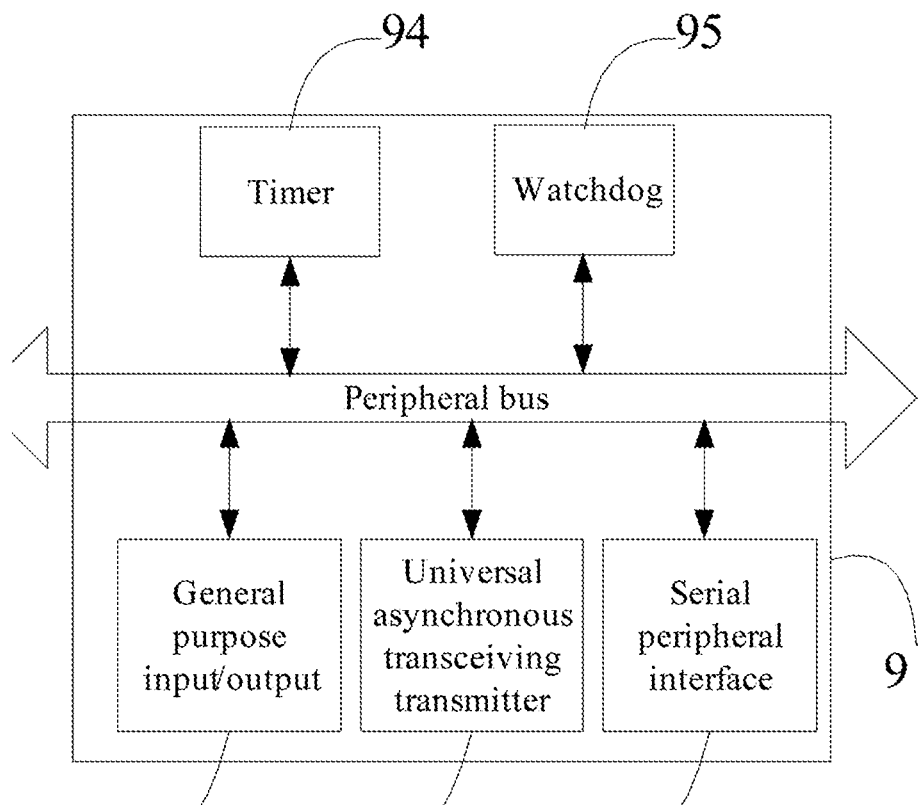
FIG. 7 is a block schematic diagram of a principle of a general peripheral subsystem.

As shown in FIG. 7, the general peripheral subsystem comprises:

a general purpose input/output 91, wherein the general purpose input/output is connected to the peripheral bus, and used for implementing configuration of an interrupt pint or a data pin of a port;

a universal asynchronous transceiving transmitter 92, which is connected to the peripheral bus, and used for implementing communication with an external device;

a serial peripheral interface 93, which is connected to the peripheral bus, and used for connecting to an external communication device;

a timer module 94, which is connected to the peripheral bus, and used for implementing time control; and a watchdog module 95, which is connected to the peripheral bus, and used for monitoring and resetting a whole system.

Figure 8:
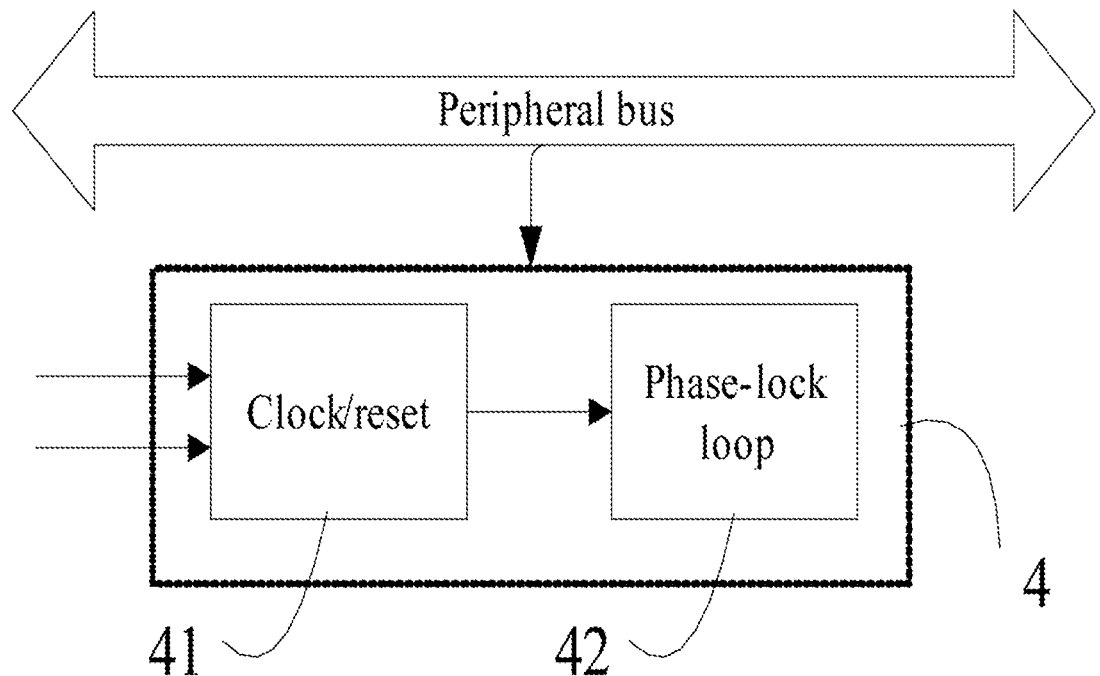
FIG. 8 is a block schematic diagram of a principle of a clock/reset management module.

As shown in FIG. 8, the clock/reset management module comprises:

a clock/reset module 41, which is connected to an external clock signal and a reset signal, and used for generating a clock needed during operation of each module, implementing clock gating management, power-on reset, external key reset, and watchdog reset; and a phase-lock loop 42, which is connected to the clock/reset 41 for generating a clock signal with needed high phase precision.

Figure 9:
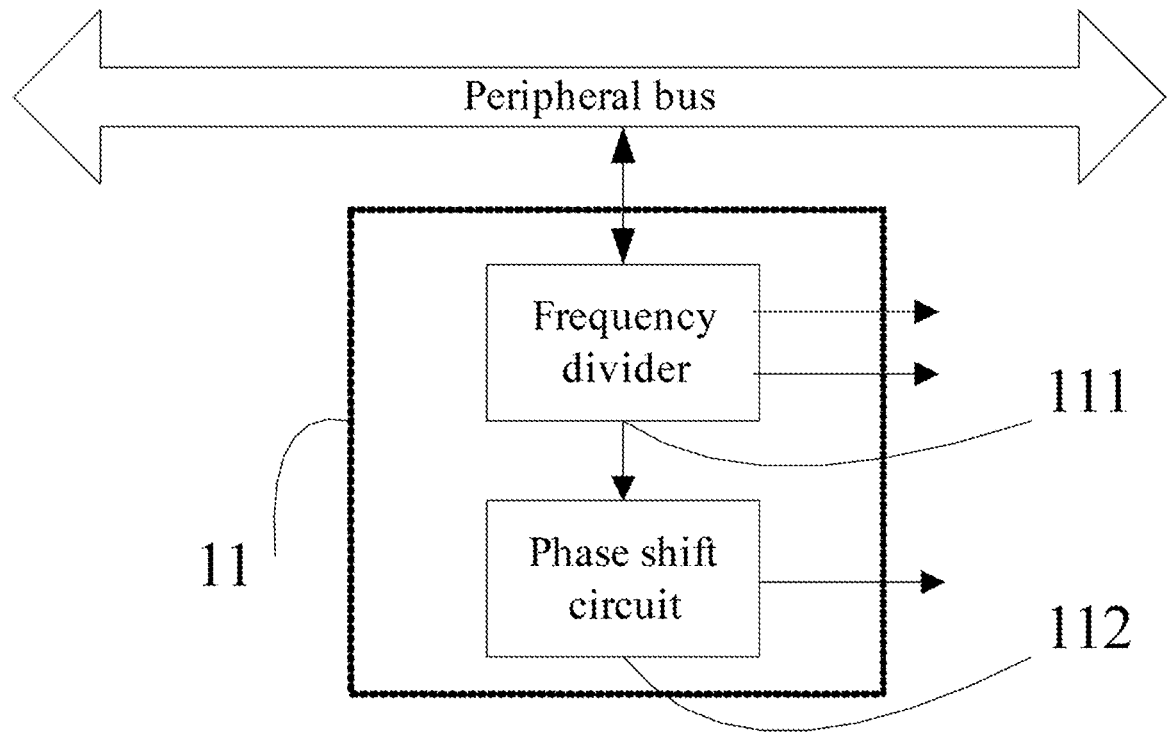
FIG. 9 is a block schematic diagram of a principle of a clock output module.

As shown in FIG. 9, the clock output module 11 comprises a frequency divider 111 and a phase shift circuit 112. The frequency divider 111 is connected to the peripheral bus, and the phase shift circuit 112 is connected to the frequency divider 111. The frequency divider is configured to generate a clock signal with a needed frequency; and the phase shift circuit is used for phase control over the clock signal.

The following briefly describes the working principle of the CPT atomic clock servo control SoC. In this implementation, a control process based on the CPT atomic clock servo control SoC comprises the following steps:

1) Part of photo signals output by a physical system of a CPT atomic clock pass through a light detection circuit, namely, V/I conversion and preamplification, to become one DC signal superimposed with two modulation signals.

After the photoelectric signals are amplified, one path of analog to digital converter I51 performs collection by using 16 bits, wherein a sampling rate is greater than or equal to 40 Ksps. Signals output by the analog to digital converter I51 are divided into two paths for selection by a user for use: one path is directly connected to an SoC bus, and is stored into a static random access memory 2 by using a direct memory access controller 13 or a microprocessor 1, for being processed by the subsequent microprocessor 1, and the other path is performed quadrature demodulation by using a photoelectric signal demodulation functional module 5, and then is stored into the static random access memory 2.

2) The physical system is a core of the CPT atomic clock. A temperature control circuit is configured to separately control temperatures of an absorption cell, a laser tube, and the like in the physical system, so that they separately stably work at suitable temperatures. Temperature control is a precondition for normal work of the CPT atomic clock. Improving temperature control performance is an important path for improving the atomic clock.

Temperature control has two loops: absorption cell temperature control and VCSEL (laser) temperature control. A high-precision analog to digital converter 1162 is need to collect thermistor output signals. The absorption cell temperature loop control needs outputs of two paths of digital to analog converters 63, and the VCSEL (laser) temperature loop needs outputs of two paths of digital to analog converters 64, and synthesis of two paths of signals are implemented off-chip to implement high-precision (24 bits) output. To control the temperature loops, temperature signal collection is performed by means of periodically query by a timer and work is performed by means of compensation control.

3) To implement laser frequency locking, low frequency modulation is separately performed a microwave and a drive DC current of a VCSEL, and then a modulated microwave signal and the modulated DC current that are of a particular power and a particular frequency are synthesized by using Bias_T, and then are input into the VCSEL of the physical system. A laser is converted, by using a photodiode, into current signals after interacting with atoms, and current-to-voltage conversion, AD collection and quadrature demodulation are performed on the current signals to obtain digital signals for transmission to a processor. After laser frequency scanning is completed, by means of processing of a series of digital signals, a frequency discrimination signal is obtained, the processor passes, through a DA output control DC source, a frequency rectification signal obtained after phase sensitive demodulation processing, to implement laser frequency locking and laser loop control.

After the laser frequency locking, modulation and phase sensitive demodulation are performed on the microwave to obtain a negative voltage feedback signal which is applied to a voltage controlled electrode of a voltage controlled crystal oscillator, to implement locking of a microwave loop.

4) A digital to analog converter 81 is configured by using the microprocessor 1 to output a adjustable voltage, and then the voltage is converted into a current signal by using a V-I conversion circuit so as to drive a solenoid, and provide a C field for the absorption cell. In this way, it can be ensured that a current flowing through the solenoid keeps unchanged when a resistance of the solenoid changes with a temperature of the physical system, thereby providing the stable C field for the absorption cell.

The present invention has the following beneficial technical effects:

The present invention has the characteristics of high commonality, high integration level, and abundant peripheral interfaces, and has a highly flexible programmability and weak signal processing capacity. The present invention facilitates implementing a miniaturization design, a low power consumption design, and a high reliability design of a CPT atomic clock system. In addition, the present invention is also an ideal choice for application of a servo control system, and can be widely applied to various control systems such as detection, telemetering and remote control, navigation, and radio measurement control systems. The present invention uses a monolithic integrated circuit design technology, and integrates modules that implement functions of photoelectric signal demodulation, temperate loop control, laser and microwave loop control, and C field control and the microprocessor onto one chip, and provides abundant peripheral interfaces, so that the present invention has highly flexible programmability, and the commonality is greatly improved. The foregoing is merely preferred embodiment of the present invention, and is not intended to limit the present invention. Apparently, a person skilled in the art can make various modifications and variations to the present invention without departing from the spirit and the scope of the present invention. In this way, if these modifications and variations of the present invention go beyond the scope of the claims and equivalent technologies thereof of the present invention, the present invention is also intended to comprise these modifications and variations.

What is claimed is:

1. A CPT atomic clock servo control SoC, comprising a microprocessor, a photoelectric signal demodulation functional module, a temperature control loop functional module, a laser and microwave loop control functional module, a C field control functional module, and a bus bridge, wherein the bus bridge is connected to a system bus and a peripheral bus, used for connecting to buses with different speeds;

the photoelectric signal demodulation functional module is connected to the peripheral bus, used for demodulating a photoelectric signal of a physical system of the atomic clock, and extracting power change information of a microwave and a laser therefrom;

the temperature control loop functional module is connected to the peripheral bus, used for separately controlling temperatures of an absorption cell and a laser tube in the physical system of the atomic clock;

the laser and microwave loop control functional module is connected to the peripheral bus, and used for performing low frequency modulation on the microwave and a drive DC current of a VCSEL, and then synthesizing, by using Bias-T, a modulated microwave signal with certain power and a certain frequency and the modulated DC current, and then inputting the synthesized signal into the VCSEL of the physical system of the atomic clock, to implement laser frequency locking; after the laser frequency locking, modulation and phase sensitive demodulation are performed on the microwave to obtain a negative voltage feedback signal which is applied to a voltage controlled electrode of a voltage controlled crystal oscillator, to implement locking of a microwave loop;

the C field control functional module is connected to the peripheral bus, configures a DAC by using a CPU, outputs a stable adjustable voltage, and then converts the voltage into a current signal by using a conversion circuit to drive a solenoid, and provides a stable C field for the absorption cell; and the microprocessor is connected to the system bus, used for controlling the photoelectric signal demodulation functional module, the temperature control loop functional module, the laser and microwave loop control functional module, and the C field control functional module.

2. The CPT atomic clock servo control SoC according to claim 1, further comprising a static random access memory, a serial flash memory controller, a clock/reset management module, a general peripheral subsystem, a time to digital conversion module, a clock output module, and a direct memory access controller, wherein the direct memory access controller is connected to the system bus, used for accessing the static random access memory under control of the microprocessor; and the static random access memory is connected to the system bus, used for caching internal data;

the serial flash memory controller is connected to the system bus, used for connecting to an external memory;

the clock/reset management module is connected to the system bus, used for setting a working mode, setting a clock of each module to implement clock gating management, so as to complete power-on reset, key reset, and watchdog reset;

the general peripheral subsystem is connected to the peripheral bus, used for implementing communication interface control and interconnection with an external computer;

the time to digital conversion module is connected to the peripheral bus, used for accurately measuring a time difference;

the clock output module is connected to the peripheral bus, used for outputting different clock frequencies and implementing clock signal transposition; and the microprocessor is configured to control the static random access memory, the serial flash memory controller, the clock/reset management module, the general peripheral subsystem, the time to digital conversion module, and the clock output module.

3. The CPT atomic clock servo control SoC according to claim 1, wherein the photoelectric signal demodulation functional module comprises an analog to digital converter I, a data selector I, a microwave demodulation path, a laser demodulation path, and a digital oscillator;

the analog to digital converter I is connected to a front end photoelectric signal amplifier, used for collecting an amplified photoelectric signal;

the data selector I is connected to the analog to the digital converter I, used for dividing data output by the analog to digital converter I into two paths, wherein one path of data is directly connected to the system bus, and the other path of data is fed into a subsequent quadrature demodulation circuit;

the microwave demodulation path is connected to the data selector I, and comprises two branches: I and Q branches, and each branch consists of a mixer I and a low pass filter I, used for demodulating to obtain a needed microwave signal;

the laser demodulation path is connected to the data selector I, and comprises two branches: I and Q branches, and each branch consists of a mixer II and a low pass filter II, used for demodulating to obtain a needed microwave signal; and the digital oscillator is separately connected to the mixer in the microwave demodulation path and the mixer in the laser demodulation path, for providing a local-frequency signal needed by demodulation.

4. The CPT atomic clock servo control SoC according to claim 1, wherein the temperature control loop functional module comprises a data selector II, an analog to digital converter II, an absorption cell temperature voltage control branch and a VCSEL temperature voltage control branch;

the data selector II is separately connected to an absorption cell temperature voltage signal amplifier and a VCSEL temperature voltage signal amplifier, used for selecting an absorption cell temperature voltage signal or a VCSEL temperature voltage signal, and feeding same into a subsequent analog to digital converter II for sampling; and the analog to digital converter II is connected to the data selector II, used for sampling the absorption cell temperature voltage signal or the VCSEL temperature voltage signal;

the absorption cell temperature voltage control branch is connected to the microprocessor by using a bus, used for converting a control signal output by the microprocessor into an analog control signal; and the VCSEL temperature voltage control branch is connected to the microprocessor by using a bus, used for converting a control signal output by the microprocessor into an analog control signal.

5. The CPT atomic clock servo control SoC according to claim 1, wherein the laser and microwave loop control functional module comprises a laser loop control branch and a microwave loop control branch;
   the laser loop control branch is connected to the microprocessor by using a bus, used for converting a control signal output by the microprocessor into an analog control signal; and
   the microwave loop control branch is connected to the microprocessor by using a bus, used for converting a control signal output by the microprocessor into an analog control signal.

6. The CPT atomic clock servo control SoC according to claim 1, wherein the C field control functional module comprises an analog to digital converter III, the analog to digital converter III is connected to the microprocessor by using a bus, used for converting a control signal output by the microprocessor into an analog control signal.

7. The CPT atomic clock servo control SoC according to claim 2, wherein the general peripheral subsystem comprises a general purpose input/output, a universal asynchronous transceiving transmitter, a serial peripheral interface, a timer module, and a watchdog module;
   the general purpose input/output is connected to the peripheral bus, used for implementing configuration of an interrupt pint or a data pin of a port; and the universal asynchronous transceiving transmitter is connected to the peripheral bus, used for implementing communication with an external device;
   the serial peripheral interface is connected to the peripheral bus, used for connecting to an external communication device;
   the timer module is connected to the peripheral bus, used for implementing time control; and
   the watchdog module is connected to the peripheral bus, used for monitoring and resetting a whole system.

8. The CPT atomic clock servo control SoC according to claim 2, wherein the clock/reset management module comprises a clock/reset and a phase-lock loop;
   the clock/reset module is configured to generate a clock needed during operation of each module, to implement clock gating management, power-on reset, external key reset, and watchdog reset; and
   the phase-lock loop is configured to generate a clock signal with needed high phase precision.

9. The CPT atomic clock servo control SoC according to claim 2, wherein the clock output module comprises a frequency divider and a phase shift circuit;
   the frequency divider is configured to generate a clock signal with a needed frequency; and
   the phase shift circuit is used for phase control over the clock signal.

* * * * *